(12) United States Patent  
Cherekdjian et al.

(10) Patent No.: US 8,338,269 B2  
(45) Date of Patent: Dec. 25, 2012

(54) METHODS AND APPARATUS FOR PRODUCING SEMICONDUCTOR ON INSULATOR STRUCTURES USING DIRECTED EXFOLIATION

(75) Inventors: Sarko Cherekdjian, Campbell, CA (US); Jeffrey Scott Cites, Horseheads, NY (US); James Gregory Couillard, Ithaca, NY (US); Richard Orr Maschmeyer, Corning, NY (US); Michael John Moore, Corning, NY (US); Alex Usenko, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 13/253,451

(22) Filed: Oct. 5, 2011

(65) Prior Publication Data

US 2012/0028443 A1 Feb. 2, 2012

Related U.S. Application Data

(62) Division of application No. 12/779,606, filed on May 13, 2010, now Pat. No. 8,058,148, which is a division of application No. 12/290,362, filed on Oct. 30, 2008, now Pat. No. 7,816,225.

(51) Int. Cl.  
*H01L 21/30* (2006.01)

(52) U.S. Cl. ............ 438/458; 438/473; 257/E21.317

(58) Field of Classification Search ............ 438/402, 438/405, 420, 516; 257/E21.317, E21.319  
See application file for complete search history.

(56) References Cited

U.S. PATENT DOCUMENTS

| | | | |
|---|---|---|---|
| 6,010,579 A | 1/2000 | Henley et al. | 148/33.2 |
| 6,387,829 B1 | 5/2002 | Usenko et al. | 438/977 |
| 6,597,039 B2 | 7/2003 | Ohmi et al. | 257/347 |
| 7,148,124 B1 | 12/2006 | Usenko | 438/458 |
| 7,176,528 B2 | 2/2007 | Couillard et al. | 257/347 |
| 7,323,398 B2 | 1/2008 | Akatsu | 438/458 |
| 7,348,258 B2 | 3/2008 | Henley et al. | 438/458 |
| 2002/0093047 A1 | 7/2002 | Ohmi et al. | 257/324 |
| 2007/0117354 A1 | 5/2007 | Gadkaree et al. | 438/478 |

OTHER PUBLICATIONS

M. Weldon et al., *On the Mechanism of the Hydrogen-induced Exfoliation of Silicon*, J. Vac Sci. Technol. B 15(4), 1065-1073 (Jul./Aug. 1997).

C. Lagahe et al., *A parallel between silicon splitting kinetics study and IR absorption analysis* 2001 IEEE International SOI Conference, Oct. 2001, 69-70 (2001).

M. Weldon et al., *Mechanism of silicon exfoliation induced by hydrogen/helium co-implantation*, Applied Physics Letters, vol. 73, No. 25, 3721-3723 (Dec. 21, 1998).

G. Cerofolini et al., *Hydrogen and helium bubbles in silicon*, Materials, Science and Engineering, 27,1-52 (2000).

J. Lee et al., *Effects of hydrogen implantation temperature on ion-cut silicon*, Journal of Applied Physics, vol. 96, No. 1, 280-288 (Jul. 1, 2004).

*Primary Examiner* — Cheung Lee  
(74) *Attorney, Agent, or Firm* — Bruce P. Watson; Siwen Chen

(57) ABSTRACT

Methods and apparatus provide for forming a semiconductor-on-insulator (SOI) structure, including subjecting a implantation surface of a donor semiconductor wafer to an ion implantation step to create a weakened slice in cross-section defining an exfoliation layer of the donor semiconductor wafer; and subjecting the donor semiconductor wafer to a spatial variation step, either before, during or after the ion implantation step, such that at least one parameter of the weakened slice varies spatially across the weakened slice in at least one of X- and Y- axial directions.

9 Claims, 13 Drawing Sheets

METHODS AND APPARATUS FOR PRODUCING SEMICONDUCTOR ON INSULATOR STRUCTURES USING DIRECTED EXFOLIATION

CROSS-REFERENCE TO RELATED APPLICATIONS

The present application is a divisional application of U.S. patent application Ser. No. 12/779,606, filed on May 13, 2010 now U.S. Pat. No. 8,058,148 and entitled "METHODS AND APPARATUS FOR PRODUCING SEMICONDUCTOR ON INSULATOR STRUCTURES USING DIRECTED EXFOLIATION," which, in turn, is a divisional application of U.S. patent application Ser. No. 12/290,362, filed on Oct. 30, 2008 now U.S. Pat. No. 7,816,225 and entitled "METHODS AND APPARATUS FOR PRODUCING SEMICONDUCTOR ON INSULATOR STRUCTURES USING DIRECTED EXFOLIATION," the content of both of which are incorporated herein by reference in their entirety.

TECHNICAL FIELD

The present invention relates to the manufacture of semiconductor-on-insulator (SOI) structures, such as those of non-circular cross section and/or those of relatively large cross sectional area.

BACKGROUND

Semiconductor on insulator devices are becoming more desirable as market demands continue to increase. SOI technology is becoming increasingly important for high performance thin film transistors (TFTs), solar cells, and displays, such as, active matrix displays, organic light-emitting diode (OLED) displays, liquid crystal displays (LCDs), integrated circuits, photovoltaic devices, etc. SOI structures may include a thin layer of semiconductor material, such as silicon, on an insulating material.

Various ways of obtaining SOI structures include epitaxial growth of silicon (Si) on lattice matched substrates, and bonding a single crystal silicon wafer to another silicon wafer. Further methods include ion-implantation techniques in which either hydrogen or oxygen ions are implanted either to form a buried oxide layer in the silicon wafer topped by Si in the case of oxygen ion implantation or to separate (exfoliate) a thin Si layer to bond to another Si wafer with an oxide layer as in the case of hydrogen ion implantation.

U.S. Pat. No. 7,176,528 discloses a process that produces an SOG (semiconductor on glass) structure using an exfoliation technique. The steps include: (i) exposing a silicon wafer surface to hydrogen ion implantation to create a bonding surface; (ii) bringing the bonding surface of the wafer into contact with a glass substrate; (iii) applying pressure, temperature and voltage to the wafer and the glass substrate to facilitate bonding therebetween; and (iv) separating the glass substrate and a thin layer of silicon from the silicon wafer.

The above approach is susceptible to an undesirable effect under some circumstance and/or when employed in certain applications. With reference to FIGS. 1A-1D, a semiconductor wafer 20 is implanted with ions, e.g., hydrogen ions, through a surface 21, such that the implantation dose is uniform in terms of density and depth across the semiconductor wafer 20.

With reference to FIG. 1A, when a semiconductor material, such as silicon, is implanted with ions, such as H-ions, damage sites are created. The layer of damage sites define an exfoliation layer 22. Some of these damage sites nucleate into platelets with very high aspect ratios (they have a very large effective diameter and almost no height). Gas resulting from the implanted ions, such as $H_2$, diffuses into the platelets to form bubbles of comparably high aspect ratios. The gas pressure in these bubbles can be extremely high and has been estimated to be as high as about 10 kbar.

As illustrated by the bi-directional arrows in FIG. 1B, the platelets or bubbles grow in effective diameter until they get close enough to each other that the remaining silicon is too weak to resist the high pressure of the gas. As there is no preferential point for a separation front to start, the multiple separating fronts are randomly created and the multiple cracks propagate through the semiconductor wafer 20.

Near the edges of the semiconductor wafer 20, a larger share of implanted hydrogen may escape from the hydrogen rich plane. This is so because of the proximity of sinks (i.e., the side walls of the wafer 20). More particularly, during implantation, the ions (e.g., hydrogen protons) decelerate through the lattice structure of the semiconductor wafer 20 (e.g., silicon) and displace some silicon atoms from their lattice sites, creating the plane of defects. As the hydrogen ions lose their kinetic energy, they become atomic hydrogen and define a further, atomic hydrogen plane. Both the defect plane and the atomic hydrogen plane are not stable in the silicon lattice at room temperature. Thus, the defects (vacancies) and the atomic hydrogen move toward one another and form thermally stable vacancy-hydrogen species. Multiple species collectively create a hydrogen rich plane. (Upon heating, the silicon lattice cleaves generally along the hydrogen rich plane.)

Not all vacancies and hydrogen undergo collapse into hydrogen-vacancy species. Some atomic hydrogen species diffuse away from the vacancy plane and eventually leave the silicon wafer 20. Thus, some of the atomic hydrogen does not contribute to cleavage of the exfoliation layer 22. Near the edges of the silicon wafer 20, the hydrogen atoms have an additional path to escape from the lattice. Therefore, the edge areas of the silicon wafer 20 may be lower in hydrogen concentration. The lower concentration of hydrogen results in the need for a higher temperature or longer time to develop enough force to support separation.

Therefore, during the separation process, a tent-like structure 24 is created with edges that are not separated. At a critical pressure, fracture of the remaining semiconductor material occurs along relatively weak planes, such as {111} planes (FIG. 1C) and the separation of the exfoliation layer 22 from the semiconductor wafer 20 is complete (FIG. 1D). The edges 22A, 22B, however, are out of a major cleavage plane defined by the damage sites. This non-planar cleavage is not desirable. Other characteristics of the separation include that the exfoliated layer 22 can be described as having "mesas", where the platelets or bubbles were, surrounded by "canyons", where the fracture occurred. It is noted that these mesas and canyons are not accurately shown in FIG. 1D as such details are beyond the capabilities of reproduction at the illustrated scale.

Without limiting the invention to any theory of operation, the inventors of the instant application believe that the time from the onset of separation to completed separation is on the order of 10's of micro-seconds using the techniques described above. In other words, the random onset and propagation of the separation is on the order of about 3000 meters/sec. Again, without limiting the invention to any theory of operation, the inventors of the instant application believe that this rate of separation contributes to the undesirable characteristic of the cleaved surface of the exfoliation layer 22 described above (FIG. 1D).

U.S. Pat. No. 6,010,579 describes a technique of uniform ion implantation into a semiconductor substrate 10 to a uniform depth Z0, taking the wafer to a temperature below that which would initiate the onset of separation, and then introducing multiple impulses of energy to the edge of the substrate 10 in the vicinity of the implant depth Z0 in order to achieve a "controlled cleave front". U.S. Pat. No. 6,010,579 states that the above approach is an improvement over so-called "random" cleavage at least as to surface roughness. The instant invention takes a directed separation approach that is significantly different from the "controlled cleave front" approach of U.S. Pat. No. 6,010,579 and different from the "random" cleaving approach.

The challenges associated with the separation of the exfoliation layer 22 from the semiconductor wafer 20 discussed above are exacerbated as the size of the SOI structure increases, and particularly when the shape of the semiconductor wafer is rectangular. Such rectangular semiconductor wafers may be used in applications where multiple semiconductor tiles are coupled to an insulator substrate. Further details regarding the manufacturing of a tiled SOI structure may be found in U.S. Application Publication No. 2007/0117354, the entire disclosure of which is hereby incorporated by reference.

SUMMARY

For ease of presentation, the following discussion will at times be in terms of SOI structures. The references to this particular type of SOI structure are made to facilitate the explanation of the invention and are not intended to, and should not be interpreted as, limiting the invention's scope in any way. The SOI abbreviation is used herein to refer to semiconductor-on-insulator structures in general, including, but not limited to, silicon-on-insulator structures. Similarly, the SOG abbreviation is used to refer to semiconductor-on-glass structures in general, including, but not limited to, silicon-on-glass structures. The abbreviation SOI encompasses SOG structures.

In accordance with one or more embodiments of the present invention, method and apparatus employed in forming a semiconductor-on-insulator (SOI) structure, provide for: subjecting a implantation surface of a donor semiconductor wafer to an ion implantation step to create a weakened slice in cross-section defining an exfoliation layer of the donor semiconductor wafer; and subjecting the donor semiconductor wafer to a spatial variation step, either before, during or after the ion implantation step, such that one or more parameters of the weakened slice vary spatially across the wafer in at least one of X- and Y- axial directions.

The spatial variation step facilitates characteristics of separation of the exfoliation layer from the donor semiconductor wafer such that such separation is directionally and/or temporally controllable.

The parameters may include one or more of the following, alone or in combination: (i) densities of nucleation sites resulting from the ion implantation step; (ii) depths of the weakened slice from the implantation surface (or the reference plane); (iii) artificially created damage locations (e.g., blind holes) through the implantation surface at least to the weakened slice; and (iv) nucleation of defect sites and/or pressure increases throughout the weakened slice using temperature gradients.

The method and apparatus further provide for elevating the donor semiconductor wafer to a temperature sufficient to initiate separation at the weakened slice from a point, edge, and/or region of the weakened slice. The donor semiconductor wafer may be subject to further temperatures sufficient to continue separation substantially along the weakened slice directionally as a function of the varying parameter(s).

Other aspects, features, advantages, etc. will become apparent to one skilled in the art when the description of the invention herein is taken in conjunction with the accompanying drawings.

BRIEF DESCRIPTION OF THE DRAWINGS

For the purposes of illustrating the various aspects of the invention, there are shown in the drawings forms that are presently preferred, it being understood, however, that the invention is not limited to the precise arrangements and instrumentalities shown.

DETAILED DESCRIPTION

Figure 1A:
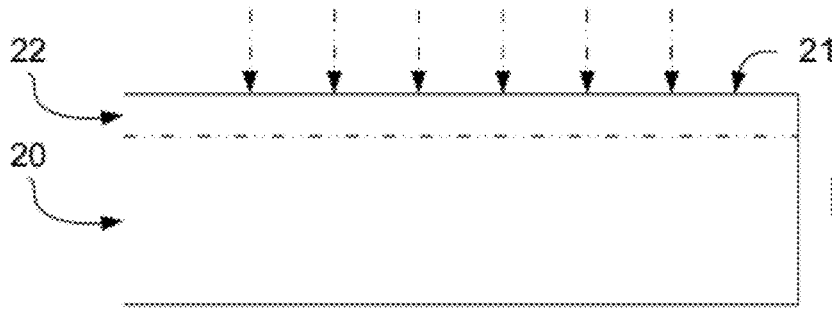
FIGS. 1A, 1B, 1C, and 1D are block diagrams illustrating an exfoliation process in accordance with the prior art.
Figure 1B:
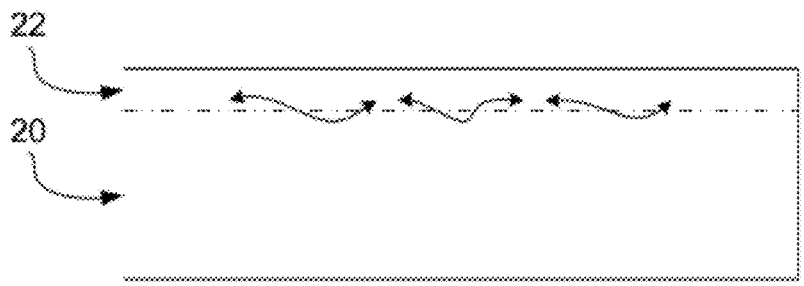
Figure 1C:
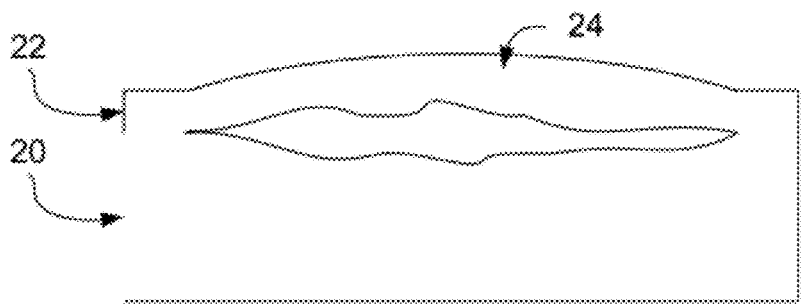
Figure 1D:
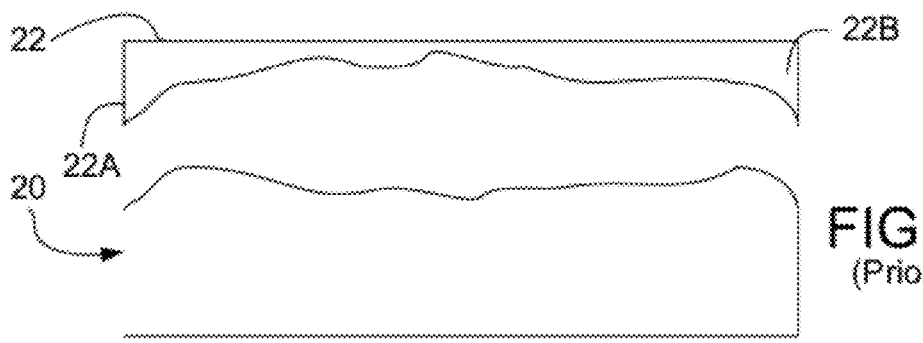
Figure 2A:
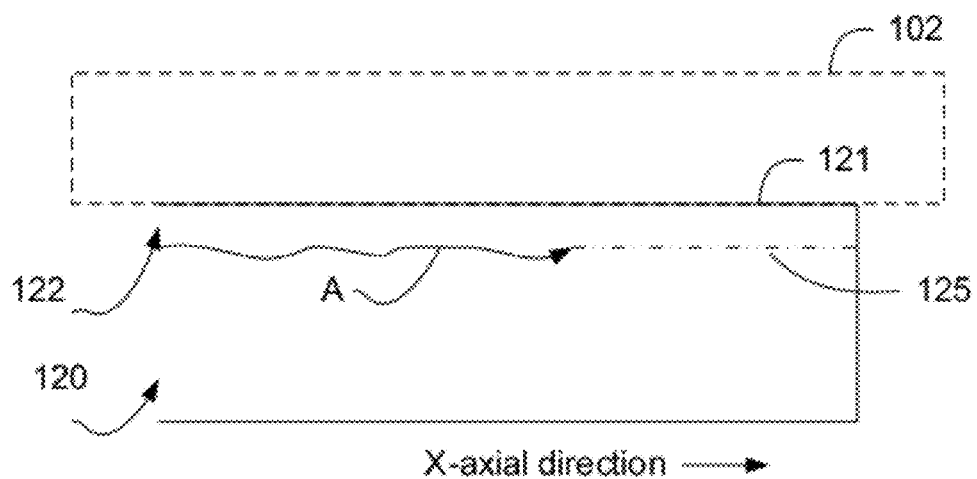
FIGS. 2A-2B are block diagrams illustrating an exfoliation process in accordance with one or more aspects of the present invention.
Figure 2B:
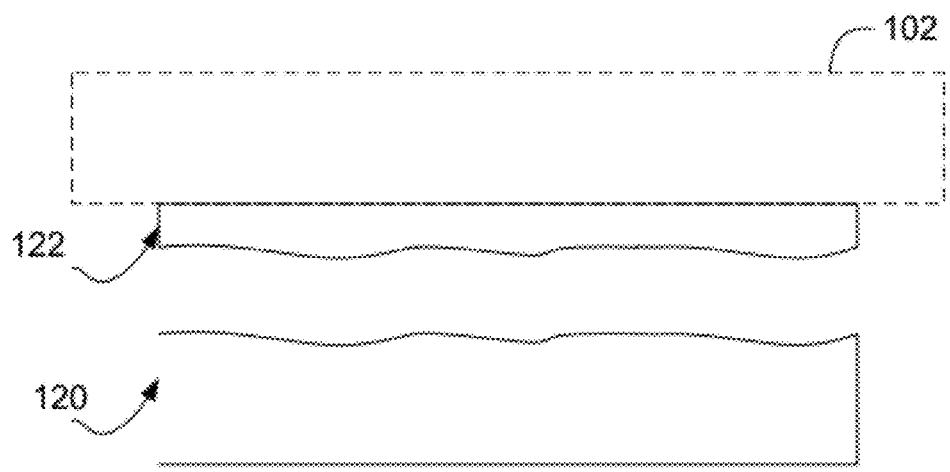

With reference to the drawings, wherein like numerals indicate like elements, there is shown in FIGS. 2A-2B an intermediate SOI structure (in particular, an SOG structure) in accordance with one or more embodiments of the present invention. The intermediate SOG structure includes an insulator substrate, such as a glass or glass ceramic substrate 102, and a donor semiconductor wafer 120. The glass or glass ceramic substrate 102 and the donor semiconductor wafer 120 have been coupled together using any of the art-recognized processes, such as bonding, fusion, adhesive, etc.

Prior to coupling the glass or glass ceramic substrate 102 and the donor semiconductor wafer 120 together, the donor semiconductor wafer 120 includes an exposed implantation surface 121. The implantation surface 121 of the donor semiconductor wafer 120 is subjected to an ion implantation step to create a weakened slice 125 in cross-section defining an exfoliation layer 122. The weakened slice 125 lies substantially parallel to a reference plane (which could be anywhere, and thus is not illustrated) defined by X-Y orthogonal axial directions. The X-axial direction is shown left-to-right in FIG. 2A, while the Y-axial direction is orthogonal to the X-axial direction into the page (and thus is not shown).

The donor semiconductor wafer 120 is subject to a spatial variation step, either before, during or after the ion implantation step, such that the characteristics of separation of the exfoliation layer 122 from the donor semiconductor wafer 120 are directionally and/or temporally controllable. While not intending to limit the invention to any theory of operation, it is believed that such directional and/or temporal controllability may result in improved separation characteristics, such as smoother exposed surfaces on the exfoliation layer 122 and the donor semiconductor wafer 120 (post separation). It is also believed that such directional and/or temporal controllability may result in improved edge characteristics, e.g., improving the yield of edges of the exposed surfaces on the exfoliation layer 122 and the donor semiconductor wafer 120 that are in a major cleavage plane defined by the weakened slice 125.

The directionally and/or temporally controllable characteristics of separation of the exfoliation layer 122 from the donor semiconductor wafer 120 may be achieved in a number of ways, such as by varying one or more parameters spatially across the weakened slice 125 in at least one of the X- and Y-axial directions. The parameters may include one or more of the following, alone or in combination: (i) densities of nucleation sites resulting from the ion implantation step; (ii) depths of the weakened slice 125 from the implantation surface 121 (or the reference plane); (iii) artificially created damage locations (e.g., blind holes) through the implantation surface 121 at least to the weakened slice 125; and (iv) nucleation of defect sites and/or pressure increases throughout the weakened slice 125 using temperature gradients.

As illustrated in FIGS. 2A-2B by the arrow A, the directionally and/or temporally controllable characteristics of separation of the exfoliation layer 122 from the donor semiconductor wafer 120 result in a propagating separation from one point, edge, and/or region to other points, edges, and/or regions of the weakened slice 125 as a function of time. This is generally achieved as follows: first, varying the one or more parameters spatially across the weakened slice 125 as discussed above, and second, elevating the donor semiconductor wafer 120 to a temperature sufficient to initiate separation at the weakened slice 125 from such point, edge, and/or region. Thereafter, the donor semiconductor wafer 120 is elevated to further temperatures sufficient to continue separation substantially along the weakened slice 125 directionally as a function of the spatial variation of the parameter(s) across the weakened slice 125. The varying parameter is preferably established such that a time-temperature profile of the elevating temperatures is on the order of seconds, and a propagation of the separation along the weakened slice 125 occurs over at least one second.

Figure 3A:
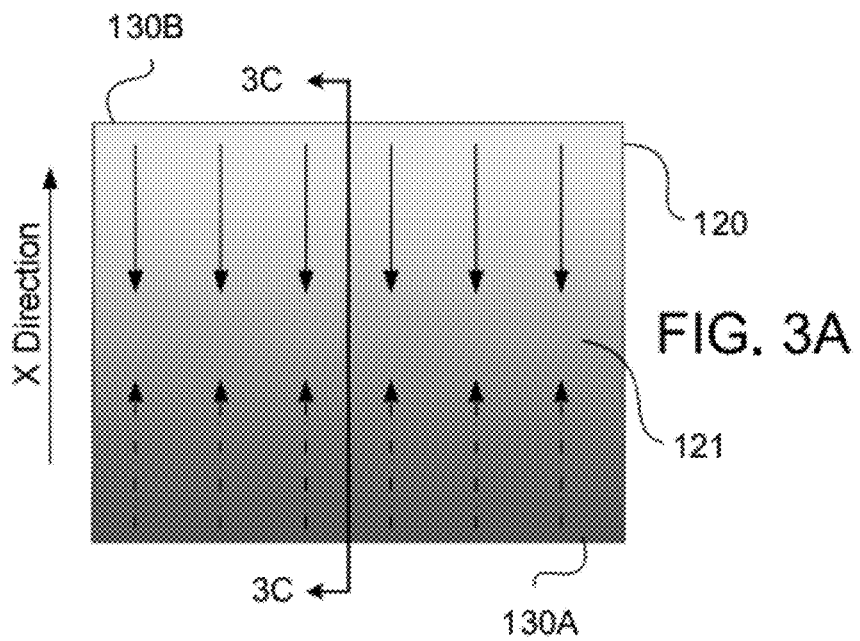
FIG. 3A is a top view of a donor semiconductor wafer having a spatially varying parameter associated with a weakened layer or slice therein in accordance with one or more aspects of the present invention.
Figure 3B:
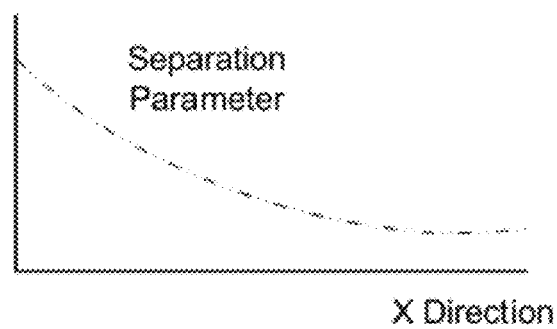
FIG. 3B is a plot that graphically illustrates the spatially varying parameter of FIG. 3A.
Figure 3C:
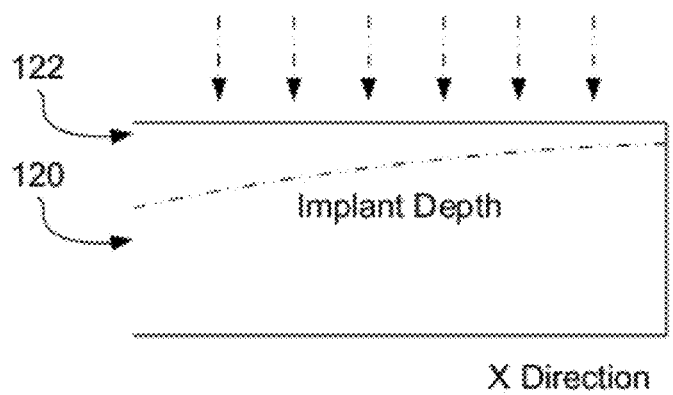
FIG. 3C is a plot that graphically illustrates that the spatially varying parameter of FIG. 3A is the depth of the weakened slice.

Reference is now made to FIGS. 3A-3C, which illustrate further details associated with varying the one or more parameters spatially across the weakened slice 125. FIG. 3A is a top view of the donor semiconductor wafer 120 viewed through the implantation surface 121. The variation in shading in the X-axial direction represents the spatial variation in the parameter (e.g., density of nucleation sites, pressure within the sites, degree of nucleation, distribution of artificially created damage sites (holes), implantation depth, etc.). In the illustrated example, the one or more parameters vary from one edge 130A in the X-axial direction toward an opposite edge 130B of the donor semiconductor wafer 120 (and thus the weakened slice 125 thereof), or vice verse.

With reference to FIG. 3B, a graph of the separation parameter illustrates the cross-sectional profile of, for example, the density of nucleation sites within the weakened slice 125 as a function of the X-axial direction. Alternatively, or in addition, the separation parameter may represent one or more of the pressure within the nucleation sites, the degree of nucleation, the distribution of artificially created damage sites (holes), etc., each as a function of the X-axial, spatial metric. With reference to FIG. 3C, a graph of the separation parameter illustrates the cross-sectional profile of, for example, the depth of the weakened slice 125 (e.g., corresponding to the ion implantation depth) as a function of the X-axial direction.

While not intending to limit the invention to any theory or theories of operation, it is believed that the propagation of separation (illustrated by broken arrows) from the edge 130A toward the edge 130B occurs when the density of nucleation sites is relatively high at edge 130A and reduces to lower densities of nucleation sites at spatial locations toward the edge 130B. This theory is also believed to hold in connection with other parameters, such as the gas pressure within the nucleation sites, the degree of merging nucleation sites prior to separation, and the distribution of artificially created damage sites (holes). As to the parameter associated with the depth of the weakened slice 125, however, it is believed that the propagation of separation (illustrated by solid arrows) from the edge 130B toward the edge 130A occurs when a substantially low depth exists along the initial edge 130B of the weakened slice 125 and comparatively higher depths exist at successively further distances toward the edge 130A.

Figure 4A:
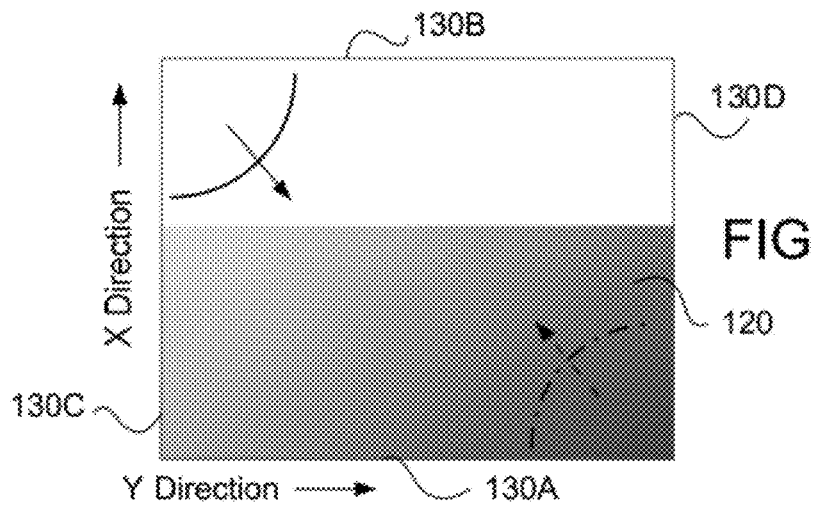
FIGS. 4A, 4B, and 4C are top views of respective donor semiconductor wafers having further spatially varying parameters in accordance with one or more further aspects of the present invention.
Figure 4B:
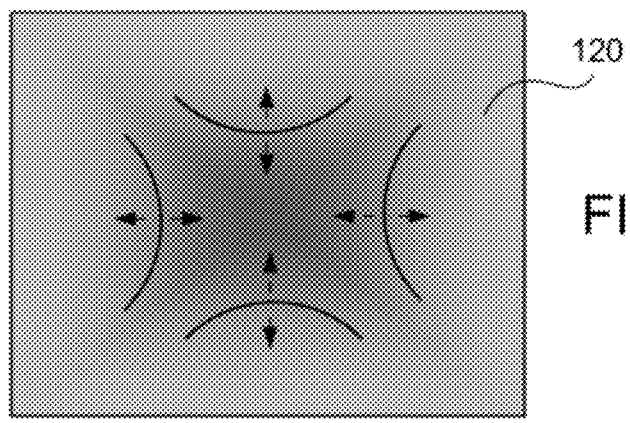
Figure 4C:
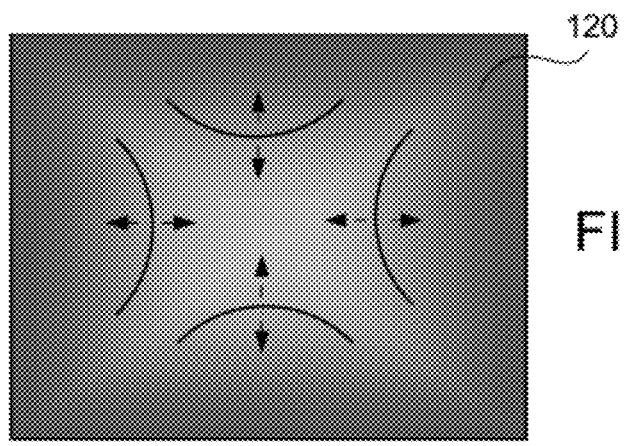

Reference is now made to FIGS. 4A-4C, which illustrate further details associated with varying the one or more parameters spatially across the weakened slice 125. The figures show top views of the donor semiconductor wafer 120 viewed through the implantation surface 121. The variation in shading in the X- and Y- axial directions represent the spatial variation in the parameter, again density of nucleation sites, pressure within the sites, degree of nucleation, distribution of artificially created damage sites (holes), implantation depth, etc. In each illustrated case, the parameter is varied spatially in both the X- and Y- axial directions.

With specific reference to FIG. 4A, the shading may represent that the parameter varies spatially starting from two edges 130A, 130D toward other edges 130B, 130C and varying at successively further distances in both the X- and Y-axial directions. In keeping with the discussion above, when considering the parameter of the density of nucleation sites, if the higher densities initiate at edges 130A, 130D, then it is believed that the propagation of separation (illustrated by the broken arrow) will radiate out from the corner of edges 130A, 130D toward the center of the wafer 120 and toward the other edges 130B, 130C. This theory is also believed to hold in connection with other parameters, such as the gas pressure within the nucleation sites, the degree of merging of nucleation sites prior to separation, and the distribution of artificially created damage sites (holes). As to the parameter associated with the depth of the weakened slice 125, however, it is believed that the propagation of separation (illustrated by the solid arrow) will radiate out from the corner of edges 130B, 130C toward the center of the wafer 120 and toward the other edges 130A, 130D when the lower depths low depth initiate along the edge 130B, 130C.

With specific reference to FIGS. 4B and 4C, the shading may represent that the parameter varies spatially starting from all edges 130 and varying toward the center of the donor semiconductor wafer 120, or vice verse.

Further details will now be provided with reference to the particular parameter of spatially varying the densities of nucleation sites resulting from ion implantation across the weakened slice 125 in one or both of the X- and Y- axial directions. No matter what technique is employed to achieve such spatial variation, it is preferred that a maximum density of nucleation sites exists at one or more edges, points, or regions of the weakened slice 125 of about $5 \times 10^5$ sites/cm$^2$ and a minimum density of nucleation sites exists spaced away therefrom in the weakened slice 125 of about $5 \times 10^4$ sites/cm$^2$. Looking at the variation in another way, a difference between the maximum density of nucleation sites and the minimum density of nucleation sites may be between about 10 fold.

In accordance with one or more aspects of the present invention, the density of nucleation sites within the weakened slice 125 may be varied spatially by varying the dose of the ion implantation step. By way of background, the weakened slice 125 (and thus the exfoliation layer 122) is created by subjecting the implantation surface 121 to one or more ion implantation steps. Although there are numerous ion implantation techniques, machines, etc. that may be utilized in this regard, one suitable method dictates that the implantation surface 121 of the donor semiconductor wafer 120 may be subject to a hydrogen ion implantation step to at least initiate the creation of the exfoliation layer 122 in the donor semiconductor wafer 120.

Figure 5A:
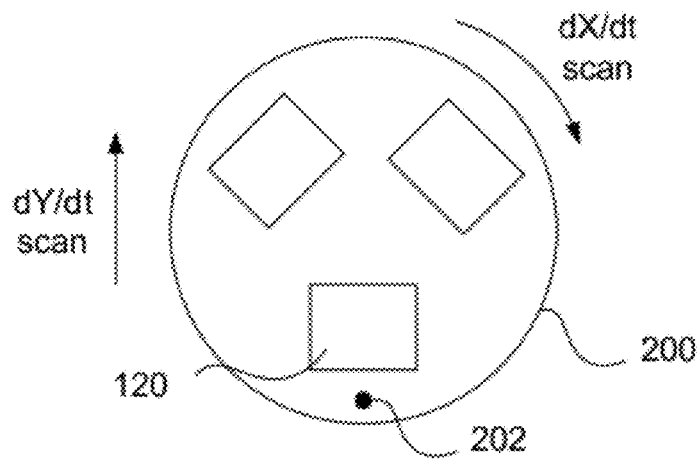
FIGS. 5A, 5B, and 5C are simplified diagrams of some ion implantation apparatus that may be adapted to achieve spatially varying parameters of the donor semiconductor wafer.

With reference to FIG. 5A, a simplified schematic of an Axcelis NV-10 type batch implanter is illustrated, which may be modified for use in spatially varying the density of nucleation sites within the weakened slice 125 by varying the dose of implanted ions.

Multiple donor semiconductor wafers 120, in this case rectangular tiles, may be distributed azimuthally at a fixed radius on a platen 200 relative to the incident ion beam 202 (directed into the page). Rotation of the platen 200 provides a pseudo-X-scan (dX/dt) while mechanical translation of the entire platen 200 provides the Y-scan (dY/dt). The term pseudo-X-scan is used because for small radius platens 200, the X-scan is somewhat more curved as compared to larger radius platens 200, and thus, perfectly straight scans are not obtained on such rotating platens 200. Modulating the X-scan speed and/or the Y-scan speed will result in spatial variation in the dose. Increasing the Y-scan speed as the ion beam 202 travels radially toward the center of the platen 200 has been used in the past to ensure a uniform dose. Indeed, as the conventional thinking in the art is to achieve a spatially uniform dose, and as the angular speed relative to the donor semiconductor wafers 120 decreases closer to the center of the platen 200, the Y-scan speed must correspondingly increase. In accordance with the invention, however, a spatially varying dose may be achieved by not adhering to the conventional scan protocol, resulting in the patterns of, for example, FIGS. 3A and 4A. For example, leaving the Y-scan speed uniform as the ion beam 202 travels radially toward the center of the platen 200. Alternatively, one could decrease the Y-scan speed as the ion beam 202 travels radially toward the center of the platen 200. Those skilled in the art will recognize other possibilities from the disclosure herein. An alternative approach is to vary the beam energy as a function of the scan rates and positions. These changes may be effected through modification to the control algorithm of the implanter in software, an electronic interface between the controlling software and the end station drive, or other mechanical modification.

Figure 5B:
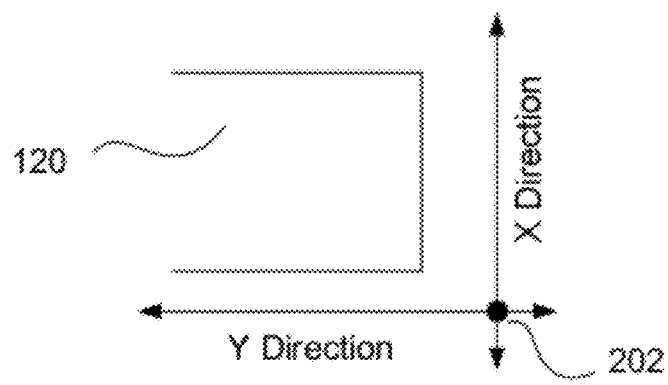

With reference to FIG. 5B, a simplified schematic of a single-substrate X-Y implanter is illustrated, which also may be modified for use in spatially varying the density of nucleation sites within the weakened slice 125 by varying the dose of implanted ions. In this case, the electronic beam 202 is scanned much faster than the mechanical substrate scan (of FIG. 5A). Again, the conventional thinking in the art is to achieve a spatially uniform dose, and thus the X and Y scanning rates and beam energy are set such that the uniform dose is achieved. Again, spatially varying dosages may be achieved by not adhering to the conventional scanning protocol. Significant spatial variation in implant dosage may be achieved through numerous combinations of variable X and Y scanning rates and/or beam energy. One-dimensional or two-dimensional gradients may be produced, either vertical or horizontal, through such variation resulting in the patterns of, for example, FIGS. 3A, 4A, 4B and 4C.

Figure 5C:
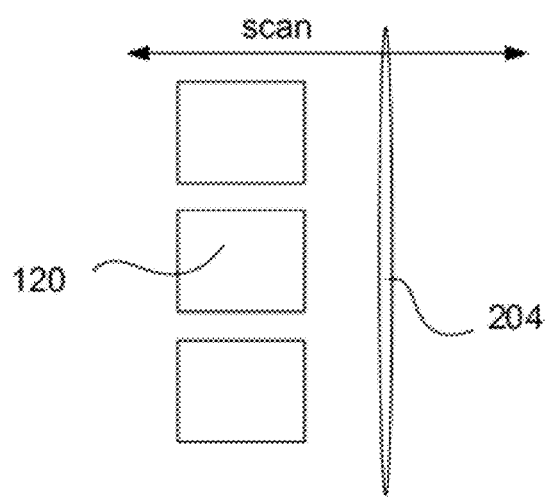

With reference to FIG. 5C, a simplified schematic of an implanter is illustrated in accordance with ion shower techniques. A ribbon beam 204 arises from an extended ion source. In accordance with conventional techniques, a single uniform speed scan (in proportion with a uniform beam energy in the orthogonal direction) can achieve conventional ideals, i.e., a spatially uniform dose. In accordance with various aspects of the invention, however, a one-dimensional gradient (e.g., that of FIG. 3A rotated 90 degrees) may be produced through variation in the mechanical scanning rate of the donor semiconductor wafers 120 through the ribbon beam 204. Twisting the donor semiconductor wafers 120 by some angle relative to the ribbon beam 204 in combination with variation in the mechanical scanning rate may produce spatial variation in the dose in a manner similar to that of FIG. 4A. Alternatively or additionally, a spatially varying beam current along the beam source would provide an orthogonal gradient to the scan direction, providing additional degrees of freedom to produce the subject spatially varying dosages.

Irrespective of the particular implantation technique employed to achieve the variation in dose, and irrespective of the location of the highest dose (e.g., along one or more initial edges, an initial point, or an initial region), the substantially highest dose is within some desirable range in units of atoms/cm$^2$ and the lowest dose further therefrom in at least one of the X- and Y- axial directions is within some other desirable range in units of atoms/cm$^2$. A difference between the maximum dose and the minimum dose may be between about 10-30%, with a maximum variation of about a factor of three. In some applications, a difference of at least about 20% has been found to be important.

In accordance with one or more further aspects of the present invention, the density of nucleation sites within the weakened slice 125 may be varied spatially by implanting a first species of ions in a substantially uniform manner to establish the weakened slice 125 with a substantially uniform distribution. Thereafter, the donor semiconductor wafer 120 may be implanted with a second species of ions in a substantially non-uniform manner. The non-uniform implantation is established such that the second species of ions causes migration of atoms to the weakened slice 125 resulting in the spatially varying densities of nucleation sites across the weakened slice 125.

By way of example, the first species of ions may be hydrogen ions and the second species of ions may be helium ions.

The non-uniform implantation may take place using the techniques described above, described later in this description, or gleaned from other sources. For example, the dose of the second species of ions may be spatially varied. The variation in the dose of the second species of ions (such as He ions) will cause a subsequent non-uniform migration of the second species to the location of the first species, thereby establishing a non-uniform density of nucleation sites. This variation will probably also vary the pressure in the platelets, which could also be beneficial.

Alternatively, the non-uniform implantation of the second species of ions may include implanting the second species of ions to varying depths spatially across the donor semiconductor wafer 120. Any of the known techniques for implanting ions to uniform depths may be modified by those skilled in the art in accordance with the teaching herein to achieve non-uniform depth profiles. By way of background, it is known that He ions can be implanted deeper than H, for example, as much as two times deeper or more. As the wafer temperature increases, much of the He ions will migrate to the site of shallower H ion implants and will provide the gas pressure for later separation. In accordance with the instant aspect of the invention, the damage caused by more deeply buried He is located at a depth in the donor semiconductor wafer 120 far from the shallower H ion implant and fewer of such He ions will arrive there in a given time. The opposite is true for the less deeply implanted He ions, thereby resulting in a spatially varying density of nucleation sites across the weakened slice 125.

While, theoretically, the spatially varied density of nucleation sites may be achieved irrespective of the order of the first and second species of ions (e.g., He implanted first or H implanted first), the order of the multiple ion implantation steps may also contribute to the desired result. Indeed, the order of implantation, depending on ion species, may have an overall effect on the density even as the density also varies spatially. While counterintuitive and surprising to many skilled artisans, it has been found that H implanted first creates more nucleation sites. For a given dose, He is recognized by skilled artisans to produce about ten times the damage as H ions. It should be noted, however, that the damage produced by the He ions (a vacancy and interstitial semiconductor atom, or Frankel pair) self anneals rapidly even at room temperature. Thus, much, but not all, of the He damage is repaired. H ions, on the other hand, bond with semiconductor atoms, such as Si atoms (forming an Si—H bond), and stabilize the damage that is created. If H is present before the He is implanted, more nucleation sites are created.

Figure 6A:
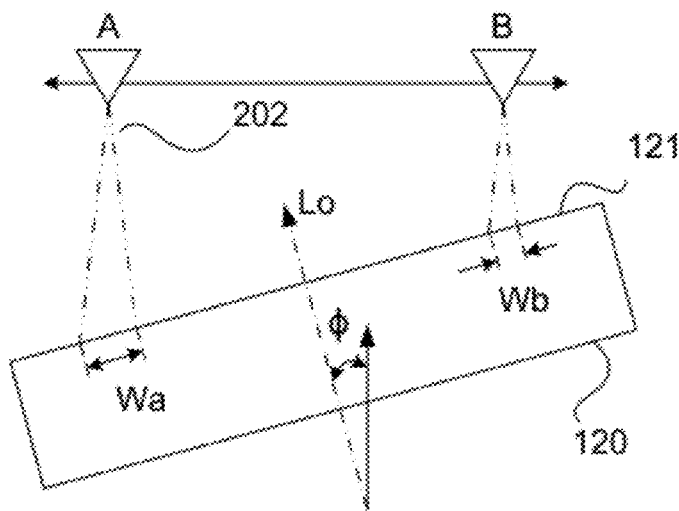
FIGS. 6A-6B illustrate an ion implantation technique that may be adapted to achieve a spatially varying density of nucleation sites in the donor semiconductor wafer.
Figure 6B:
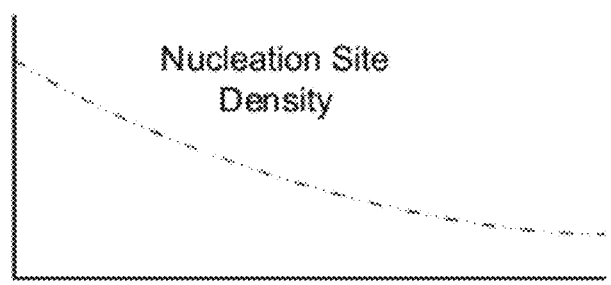

Reference is now made to FIGS. 6A-6B, where a further example is illustrated that may be suitable for achieving the spatial variation in the density of nucleation sites. In this example, as illustrated in FIG. 6A, the spatial variation in the density of nucleation sites is achieved by adjusting the beam angle of the ion beam during the ion implantation step. Although the beam angle may be adjusted in a number of ways, one such approach is to tilt the donor semiconductor wafer 120 with respect to the ion beam (e.g., a dot beam 202) as illustrated in FIG. 6A. The donor semiconductor wafer 120 has a width (left-to-right as shown on the page), a depth (into the page) and a height (top-to-bottom as shown on the page). The width and depth may define the X- and Y- axial directions, and the height may define a longitudinal axis, Lo, normal to the implantation surface 121. The donor semiconductor wafer 120 is tilted such that the longitudinal axis Lo thereof is at an angle (I) with respect to a directional axis of an ion implantation beam (shown as a solid arrow) during the ion implantation step. The angle Φ may be between about 1 to 45 degrees.

Under a tilt condition, as the beam source scans from location A to location B, the width W of the beam 202 varies at the implantation surface 121 of the donor semiconductor wafer 120 from width Wa to width Wb, or vice versa. The variation in width W contributes to a variation in the densities of nucleation sites resulting from the ion implantation in the scanning directions (which may be set up to vary along at least one of the X- and Y- axial directions).

The implant beam 202 may include hydrogen ions, which have the same (positive) electrical charge. As particles with the same charge repel each other, the beam 202 is wider at a longer distance from ion source (position A), and narrower at a shorter distance from ion source (position B). The more focused (lower width Wb) ion beam at position B heats the local area of the donor semiconductor wafer 120 to a higher degree than the less focused (higher width Wa) ion beam at position A. Under higher temperature, more hydrogen ions diffuse out from such local area, and a lower share of hydrogen ions remain as compared to other areas. As illustrated in FIG. 6B, this results in laterally non-uniform distribution of hydrogen (and thus the density of nucleation sites) in the weakened slice 125 of the donor semiconductor wafer 120.

Similar spatial variation in the density of nucleation sites may be achieved by adjusting the angle of the beam source or incorporating some of the known mechanisms for adjusting the collimation of the ion beam 202.

A further technique that may be suitable for achieving the spatial variation in the density of nucleation sites is to employ a two-stage ion implantation step. A first ion implantation is performed to implant ions that have the effect of attracting a second species of ions. Thereafter, the second species of ions are implanted. The first species of ions are implanted in a spatially non-uniform manner, using any of the suitable techniques described above or later herein. Thus, when the second species of ions are implanted, and migrate to the first species, the resultant weakened slice 125 exhibits a non-uniform density of nucleation sites.

For example, the first ion species may be based on the material of the donor semiconductor wafer 120, such as using silicon ions for implantation in a silicon donor semiconductor wafer 120. Such Si ions may have the property of trapping a second species of ions, such as hydrogen ions. As noted above, H ions bond with some semiconductor atoms, such as Si atoms, forming an Si—H bond. As an example, silicon-into-silicon implantation may be performed at doses and energies known in the art, such as is described in U.S. Pat. No. 7,148,124, the entire disclosure of which is incorporated by reference. Unlike the prior art, however, a spatial density distribution of the trapping ion specie (in this case Si) is non-uniform (e.g., highest at one edge and lowest on an opposite edge of the donor semiconductor wafer 120, or other variations discussed herein). Next, a second species of ions, such as hydrogen, is implanted, which may be a uniform distribution. The amount of hydrogen remaining in the weakened slice 125 of the donor semiconductor wafer 120 will depend on two factors: (1) the concentrating distribution of sites that are able to trap the second species, hydrogen, and (2) the available hydrogen (the hydrogen implanted and remaining from the implant dose).

It is noted that the non-uniform spatial distribution of the species may be reversed to achieve a similar result. For example, the first species may implanted uniformly, followed by a non-uniform implantation of the second species. Alternatively, both implants may be spatially non-uniform. The non-uniform distribution of the second species (e.g., hydrogen) within the weakened slice 125 results in a point, edge or region of highest concentration of hydrogen, which in turn is location of the lowest temperature for initiating cleavage.

Again, with reference to FIGS. 2A-2B, the arrow A illustrates the directionally and/or temporally controllable characteristics of separation of the exfoliation layer 122 from the donor semiconductor wafer 120, where a propagating separation from one a point, edge, and/or region to other points, edges, and/or regions of the weakened slice 125 is achieved as a function of time. In the context of spatial variation of the density of nucleation sites, the donor semiconductor wafer 120 is elevated to a temperature sufficient to initiate separation at the weakened slice 125 from a point, edge, and/or region of highest density. It has been found that high hydrogen concentrations in silicon allows separation at temperatures as low as 350° C. or lower, while silicon with lower concentrations of hydrogen separates at higher temperatures, such as 450° C. or more. The donor semiconductor wafer 120 is elevated to further temperatures sufficient to continue separation substantially along the weakened slice 125 directionally as a function of the spatial variation of the density across the weakened slice 125.

Further details will now be provided with reference to the particular parameter of spatially varying the depth of the weakened slice 125 resulting from ion implantation in one or both of the X- and Y- axial directions. No matter what technique is employed to achieve such spatial variation, it is preferred that a substantially low depth is between about 200-380 nm and a highest depth is between about 400-425 nm. Looking at the variation in another way, a difference between the maximum and minimum depths may be between about 5-200%.

In accordance with one or more aspects of the present invention, the depth of the weakened slice 125 may be varied spatially by adjusting beam angle of the ion beam during the ion implantation step. Indeed, the process discussed with respect to FIGS. 6A-6B may have applicability to adjusting the depth of the weakened slice 125. (It is noted that the mechanism of varying temperature as a function of beam width is not believed to be the reason that variations in the depth of the weakened slice 125 are achieved.)

Figure 7A:
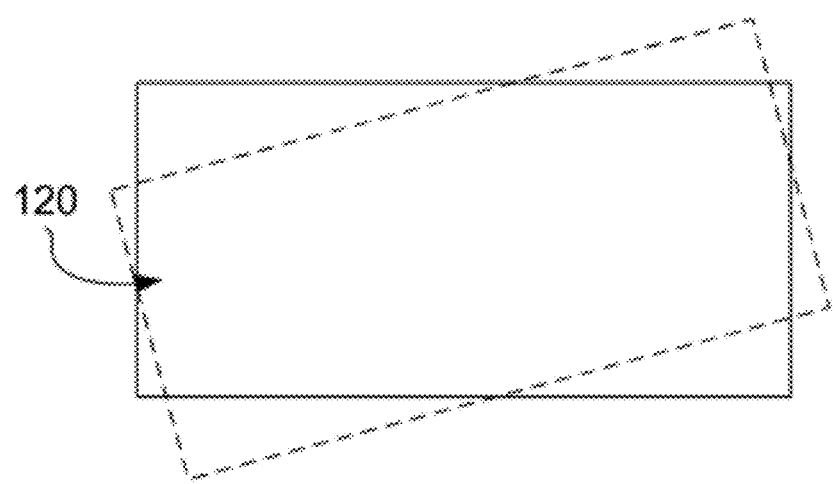
FIGS. 7A-7B illustrate an ion implantation technique that may be adapted to achieve a spatially varying implantation depth in the donor semiconductor wafer.
Figure 7B:
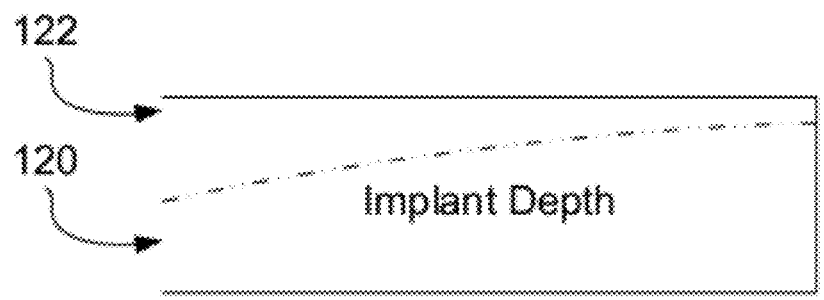

With reference to FIGS. 6A, and 7A-7B, the spatial variation in the depth of the weakened slice 125 may be achieved by varying at least one of: (1) the angle Φ of tilt (shown and described with reference to FIG. 6A); and (2) a twist of the donor semiconductor wafer 120 about the longitudinal axis Lo thereof with respect to the directional axis of the ion implantation beam 202. Adjustments in the tilt and/or twist are made to adjust a degree of channeling through the lattice structure of the donor semiconductor wafer 120, where such channels tend to align and misalign with the ion beam 202 as the ion beam 202 scans across the implantation surface 121. As the degree of channeling varies spatially, so does the depth of the weakened slice 125.

The angle Φ may be between about 1-10 deg degrees and the angle of twist may be between about 1-45 degrees.

Figure 7C:
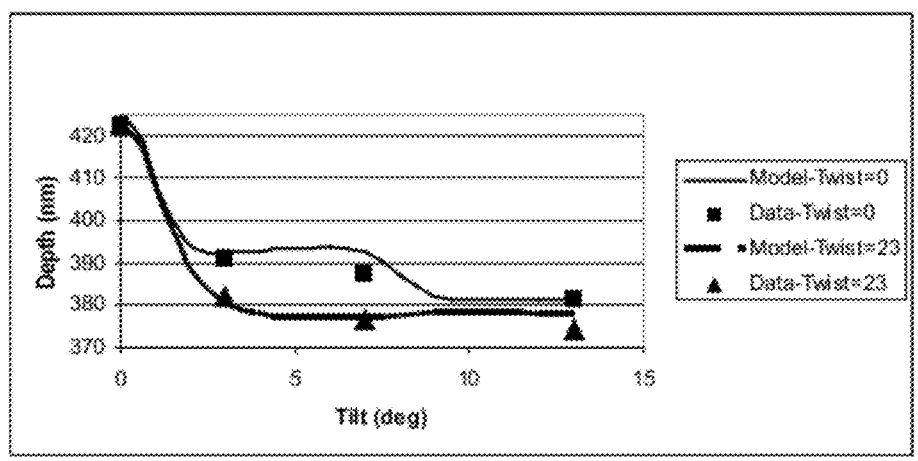
FIGS. 7C-7D are graphs illustrating relationships between tilt angle of ion implant and implant depth.
Figure 7D:
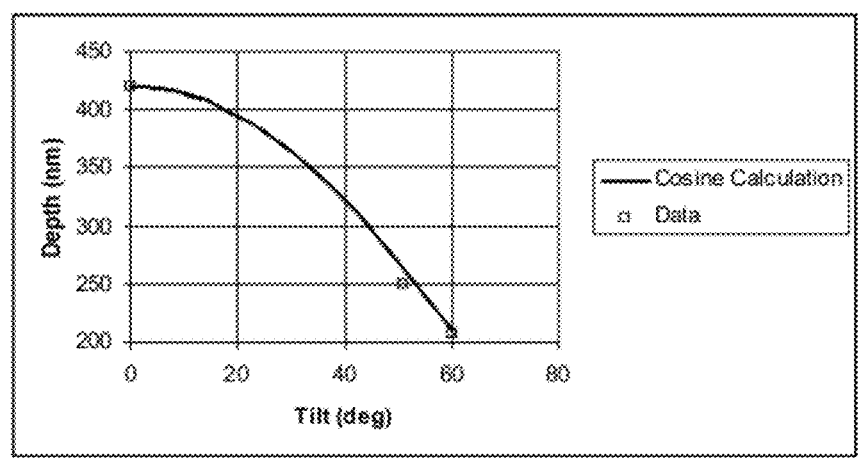

As inferred above, and with further reference to FIGS. 7C and 7D, implant depth gets smaller as tilt gets bigger. For relatively small angles (e.g., 0-10 deg), the relationship between implant depth and tilt is dominated by channeling. For relatively larger angles, the cosine effect dominates. In other words, the resultant exfoliation film thickness is essentially proportional to the cosine of the implant angle.

Alternatively or additionally, the spatial variation step may include varying an energy level of the ion beam 202 such that as the ion beam 202 scans across the implantation surface 121 of the donor semiconductor wafer 120, depths of the weakened slice 125 from the implantation surface 121 vary spatially across the donor semiconductor wafer 120.

As illustrated in FIG. 7B, the above techniques results in a laterally non-uniform depth of the weakened slice (or implant depth) of the donor semiconductor wafer 120.

Figure 8A:
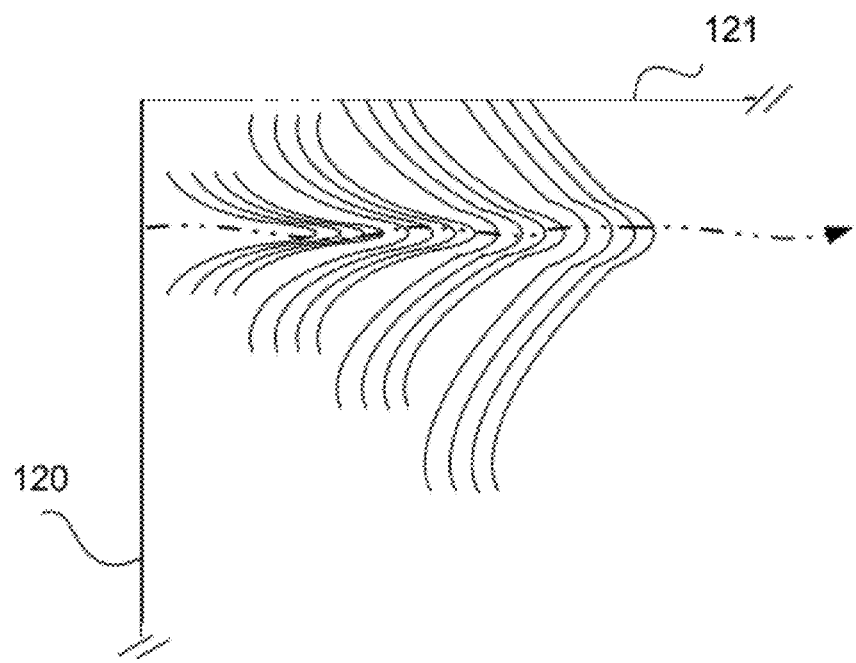
FIGS. 8A-8B illustrate an ion implantation technique that may be adapted to achieve a spatially varying ion implantation distribution width in the donor semiconductor wafer.
Figure 8B:
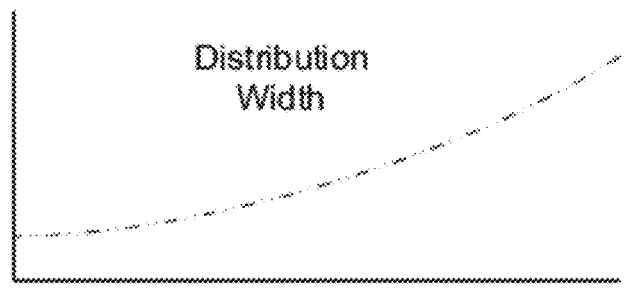

In connection with adjusting the tilt of the donor semiconductor wafer 202, a further parameter that may be exploited to achieve spatial variations is the width of the ion deposition distribution (or straggle). As illustrated in FIG. 8A, the width of the ion distribution through the weakened slice 125 (top-to-bottom) varies as a function of the angle of the tilt of the donor semiconductor wafer 120 (or more generally the beam angle). Thus, by varying the tilt angle, a spatially varying distribution width may be achieved in the weakened slice 125 (as illustrated in FIG. 8B). While not intending to be limited by any theory of operation, it is believed that the portions of the weakened slice 125 having narrower distribution widths will separate at lower temperatures than the portions of the weakened slice 125 having wider distribution widths. Thus, it is believed that directionally and/or temporally controllable characteristics of separation of the exfoliation layer 122 from the donor semiconductor wafer 120, where a propagating separation from one a point, edge, and/or region to other points, edges, and/or regions of the weakened slice 125 may be achieved as a function of time and temperature.

Figure 8C:
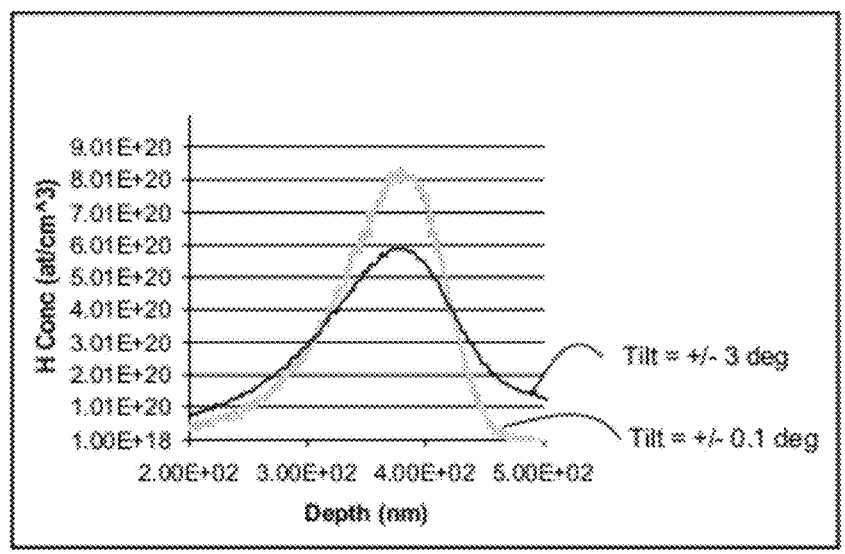
FIG. 8C is a graph illustrating a relationship between ion implant tilt angle and straggle.

With reference to FIG. 8C, additional data regarding the effect of the tilt on the straggle, which again has an impact on the width of the implant profile. The dose used in both implants illustrated in FIG. 8C are the same. Although the peak H concentration is different, both implants exfoliate. Thus, the difference between a tilt variation of +/−0.1 deg and +/−3 deg is significant for straggle.

Figure 9A:
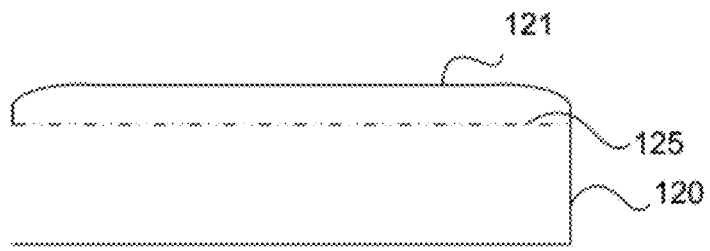
FIGS. 9A-9D illustrate a further ion implantation technique that may be adapted to achieve a spatially varying ion implantation depth in the donor semiconductor wafer.

With reference to FIGS. 9A-9D, another technique for spatially varying the depth of the weakened slice 125 includes subjecting the donor semiconductor wafer 120 to a post implantation material removal process such that the depths of the weakened slice 125 from the implantation surface 121 vary spatially across the donor semiconductor wafer 120. As illustrated in FIG. 9A, the donor semiconductor wafer 120 may be subject to some deterministic polishing process or plasma-assisted chemical etching (PACE). These techniques permit local control of the amount of material removed by the polishing step. Other methods, including Reactive Ion Etching (RIE), Chemical Mechanical Polishing (CMP), and wet chemical etching may also have non-uniform material removal across the exposed surface which is regular and reproducible. One or more of these or other techniques may be used to introduce slight variation in the depth of the weakened slice 125 from the implantation surface 121, such as any of those illustrated in FIGS. 3A, 4A, 4B, 4C, and others. The ion implantation step prior to material removal may be spatially uniform or non-uniform.

Figure 9B:
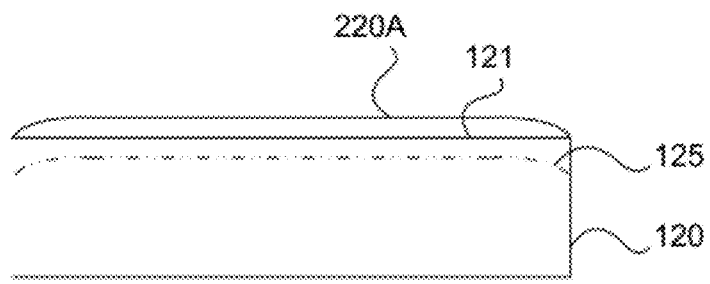
Figure 9C:
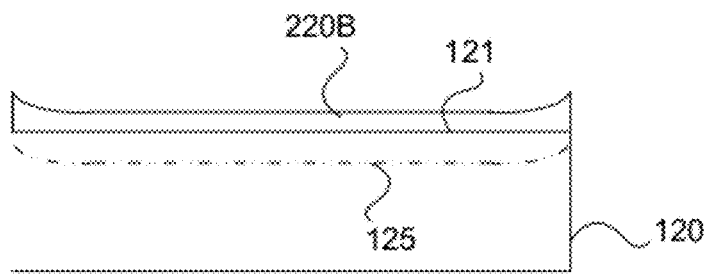

With reference to FIGS. 9B and 9C, the spatial variation step may include using a mask 220A or 220B on the implantation surface 121 of the donor semiconductor wafer 120 in a spatially non-uniform manner such that penetration of the ions is impeded to varying degrees as the ion beam 202 scans across the implantation surface 121. The masking film 220 may include silicon dioxide, organic polymers such as photoresist, and others. Possible deposition techniques include plasma-enhanced chemical vapor deposition (PECVD), spin coating, Polydimethylsiloxane (PDMS) stamping, etc. The masking film 220 thickness may be less than or comparable to the intended depth of the weakened slice 125. As the depth to which ions are implanted is determined by the energy of the incident ions, the impeding action of the mask 220 will translate into spatial modulation in primarily the depth of the implanted species in the donor semiconductor wafer 120. Depending on the characteristics of the deposited mask 220, the desired characteristic may be achieved by adding length to the ion path, scattering the ions to alter the degree of channeling, or other phenomena.

Figure 9D:
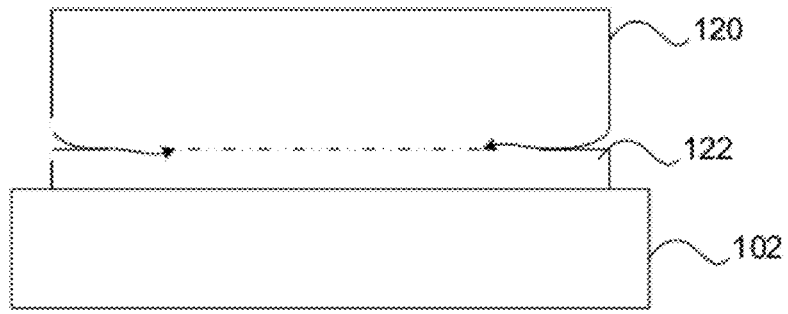

As illustrated in FIG. 9D (which illustrates lower depths on all edges of the weakened slice 125 and higher depths toward the center thereof), after or during bonding to the substrate 102, the donor semiconductor wafer 120 is elevated to a temperature sufficient to initiate separation at the weakened slice 125 from a point, edge, and/or region of lowest depth. The donor semiconductor wafer 120 is elevated to further temperatures sufficient to continue separation substantially along the weakened slice 125 directionally as a function of the spatial variation of the depth from lowest depth to highest depth.

Figure 10A:
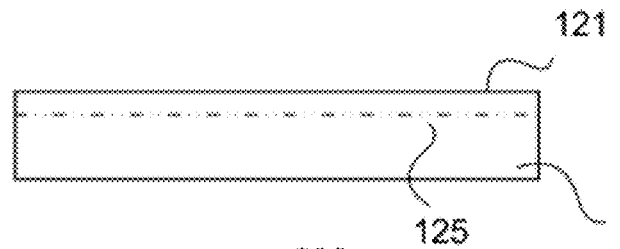
FIGS. 10A-10D and 11 illustrate a further ion implantation technique that may be adapted to achieve a spatially varying distribution of defect sites in the donor semiconductor wafer.
Figure 10B:
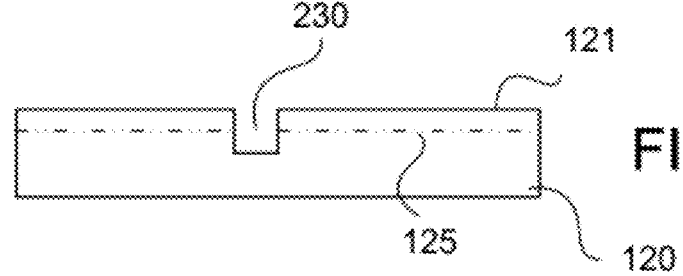
Figure 10C:
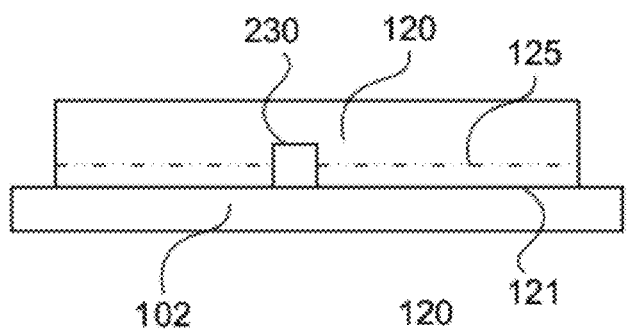
Figure 10D:
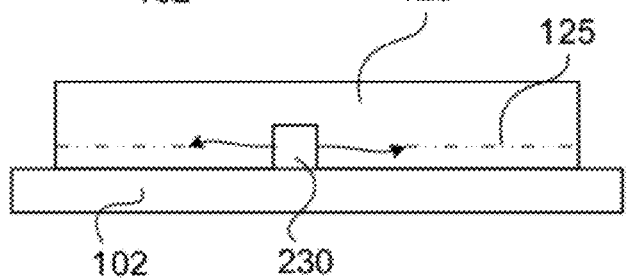
Figure 11:
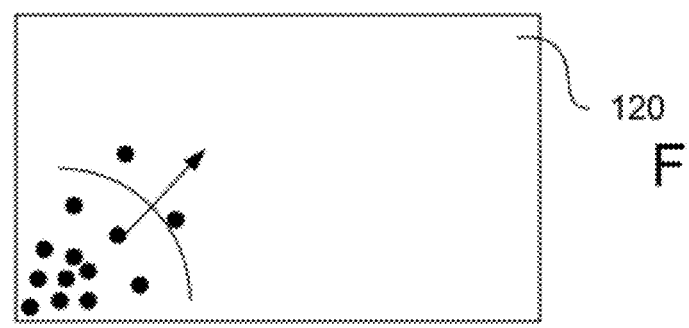

With reference to FIGS. 10A-10D and 11, the spatial variation step may include boring one or more blind holes 230 through the implantation surface 121 at least to the weakened slice 125, and preferably through the weakened slice 125 (FIG. 10B). While not intending to limit the invention to any theory of operation, it is believed that during or after bonding to the substrate 102 (FIG. 10C), elevating the donor semiconductor wafer 120 to higher temperature will initiate separation at the blind hole 230 (FIG. 10D) prior to separation at locations without such hole. As illustrated in FIG. 11, boring an array of blind holes 230 through the implantation surface 121 may create a non-uniform spatial distribution of such holes. Thus, elevating the donor semiconductor wafer 120 to temperatures sufficient to initiate and continue separation substantially along the weakened slice 125 may be achieved directionally as a function of the distribution of the array of blind holes 230, from highest to lowest concentration.

Figure 12A:
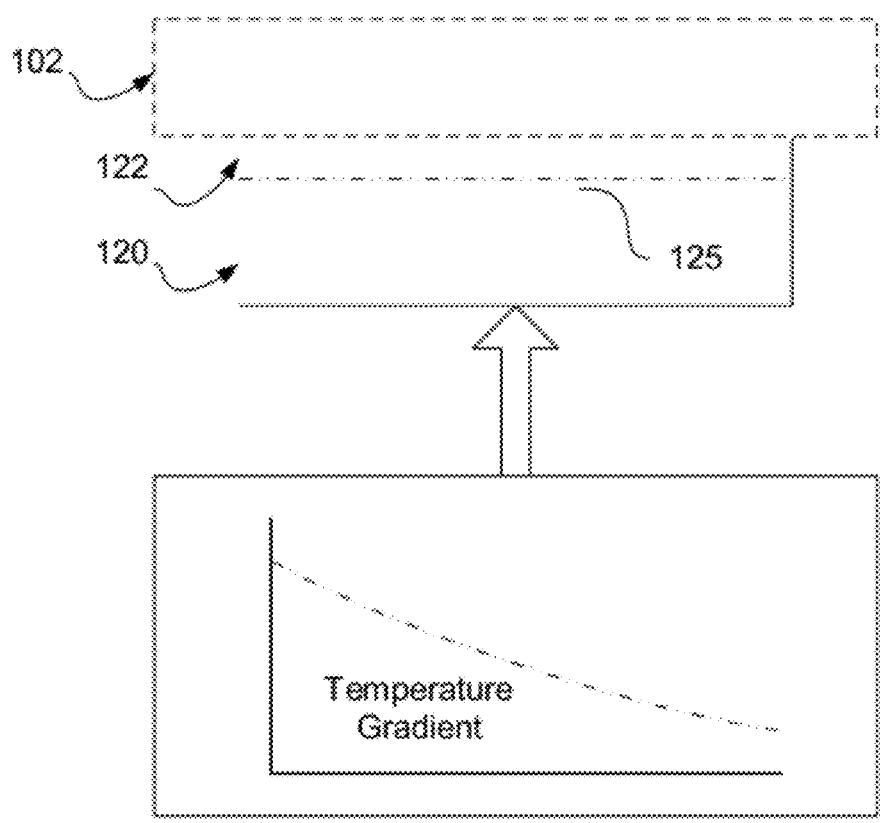
FIGS. 12A-12B illustrate a time-temperature profile technique that may be adapted to achieve a spatially varying parameter profile in the donor semiconductor wafer.
Figure 12B:
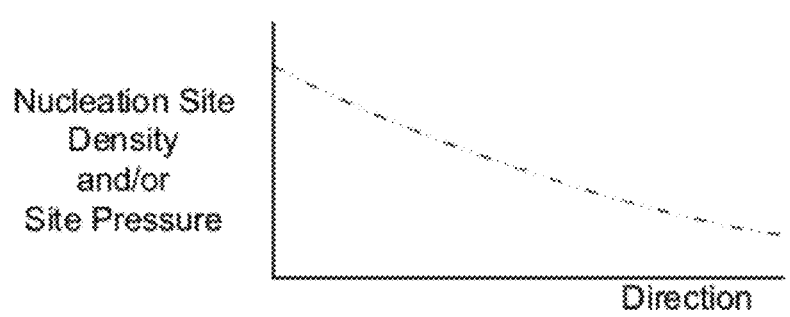

With reference to FIGS. 12A-12B, the spatial variation step may include subjecting the donor semiconductor wafer 120 to a non-uniform time-temperature profile such that the nucleation site density or pressure at respective spatial locations throughout the weakened slice 125 vary spatially across the donor semiconductor wafer 120. For example, the illustrated temperature gradient in FIG. 12A applies a higher temperature to the left side of the wafer 120 as compared to the right side. This temperature gradient may be applied either before bonding or in-situ during bonding to the substrate 102. Over time, if the process time is kept below the separation threshold for the given process temperature, at least one of the nucleation of defect sites and the gas pressure therein increases throughout the weakened slice 125 in varying degrees, spatially across the wafer 120 as a function of the temperature gradient (see FIG. 12B). The separation threshold time for a given process temperature is expected to follow an Arrhenius relationship, where the separation threshold time is exponentially proportional to the inverse of the process temperature. The parameter of interest is the ratio of the process time to the separation threshold time at the process temperature. Any of the aforementioned spatially varying parameter profiles discussed herein or otherwise desirable may be achieved by adjusting the process time-separation time ratio profile. Then, the donor semiconductor wafer 120 is elevated to a temperature sufficient to initiate separation at the weakened slice 125 from a point, edge, and/or region of maximum process time-separation time ratio. In the illustrated example, the maximum process time-separation time ratio is on the left side of the wafer 120. The donor semiconductor wafer 120 is then elevated to further temperatures sufficient to continue separation substantially along the weakened slice 125 directionally as a function of the varying time-temperature profile, from maximum process time-separation time ratio(s) to minimum process time-separation time ratio(s). Depending on material characteristics and other factors, including ion species, dose, and implant depth, the substantially high process time-separation time ratio is between about 0.9 and 0.5 and a lowest process time-separation time ratio is between about 0 and 0.5.

Various mechanisms may be used pre-bonding or in-situ bonding to achieve the spatially varying time-temperature profile. For example, one or more spatially non-uniform conductive, convective, or radiating heating techniques (hotplate, laser irradiation, visible/infrared lamp, or other) may be employed to heat the donor semiconductor wafer 120. Controlled time/temperature gradients may be achieved by direct or indirect thermal contact (conduction) to achieve any of the desirable profiles. An addressable, two-dimensional array of hotplate elements may be used to achieve different profiles based on computer control or programming. Localized infrared radiation, employing, for example, a lamp as used in rapid thermal annealing (radiation) may be employed, and/or visible or near-infrared laser radiation may be used to provide localized and spatially non-uniform heating (radiation). Alternatively, application of a uniform or non-uniform thermal profile through any means and application of a spatially non-uniform cooling mechanism, such as direct contact (conductive), or gas or fluid flow jets (conductive/convective), may be employed to achieve the desired time-temperature gradient.

Again, these heating/cooling techniques may be used pre-bonding or in-situ. In connection with in-situ bonding techniques, the bonding apparatus described in, for example, U.S. patent application Ser. No. 11/417,445, entitled HIGH TEMPERATURE ANODIC BONDING APPARATUS, the entire disclosure of which is hereby incorporated by reference, may be adapted for use in accordance with the present invention. Management of thermal radiation loss in the bonding apparatus may be controlled, and thus exploited to achieve the time-temperature gradient, through the incorporation of infrared reflecting elements around the perimeter of the bonding apparatus to minimize radiation loss and maximize edge temperature. Conversely, management of thermal radiation loss in the bonding apparatus may be controlled through the incorporation of cooled infrared absorbers to maximize radiation loss and minimize edge temperature. Many variations on the above themes may be used to achieve the desired time-temperature gradient.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A method of forming a semiconductor-on-insulator (SOI) structure, comprising:

subjecting an implantation surface of a donor semiconductor wafer to an ion implantation step to create a weakened slice in cross-section defining an exfoliation layer of the donor semiconductor wafer, where the donor semiconductor wafer has a width, a depth and a height, the width and depth defining X- and Y- axial directions, and the height defining a longitudinal axis; and wherein the ion implantation step includes spatially varying the implantation of ions in at least one of the X- and Y- axial directions such that ions are implanted at a maximum depth below the implantation surface one of (a) along an initial edge, (b) at an initial point, or (c) in an initial region of the weakened slice of the donor semiconductor wafer and at comparatively shallower depths below the implantation surface at successively further distances for the one of (a) the initial edge, (b) the initial point, or (c) the initial region in the at least one of the X- and Y- axial directions, such that a depth of the weakened slice below the implantation surface resulting from the ion implantation step varies spatially across the weakened slice in at least one of the X- and Y- axial directions from the maximum depth to a minimum depth;

elevating the donor semiconductor wafer to a temperature sufficient to initiate separation at the weakened slice from the one of (a) the initial edge, (b) the initial point, or (c) the initial region in the at least one of the X- and Y- axial direction; and further elevating the temperature of the donor semiconductor wafer in a controlled manner to further temperatures to continue separation along the exfoliation layer in the at least one of the X- and Y- axial directions from highest density to lowest density in a controlled manner as a function of the varying depths of nucleation sites.

2. The method of claim 1, wherein:

the donor semiconductor wafer is rectangular; and the spatial variation step includes spatially varying the depth of the weakened slice such that a substantially high depth exists at each of at least two edges of the weakened slice of the donor semiconductor wafer and comparatively lower depths exist at successively further distances from the at least two edges toward a center of the weakened slice.

3. The method of claim 2, wherein the spatial variation step includes spatially varying the depth of the weakened slice such that a substantially high depth exists at all edges of the weakened slice and comparatively lower depths exist at successively further distances toward the center of the weakened slice.

4. The method of claim 1, wherein a difference between the maximum depth and the minimum depth is between about 5% to about 200%.

5. The method of claim 1 wherein the depth of the weakened slice is varied spatially by varying a beam angle $\Phi$ of an ion implantation beam relative to the implantation surface during the ion implantation step.

6. The method of claim 5, wherein the beam angle $\Phi$ is varied in a range from about 1° to about 10°.

7. The method of claim 1, wherein the depth of the weakened slice is varied spatially by varying an angle of twist of the donor semiconductor wafer about the longitudinal axis with respect to the directional axis of an ion implantation beam during the ion implantation step.

8. The method of claim 7, wherein and the angle of twist is varied in a range from about 1° to about 45°.

9. The method of claim 1, wherein the depth of the weakened slice is varied spatially by varying an energy level of an ion implantation beam during the ion implantation step.

* * * * *